US009778373B2

(12) United States Patent
Nilsson et al.

(10) Patent No.: US 9,778,373 B2
(45) Date of Patent: Oct. 3, 2017

(54) DETECTOR DIODE

(75) Inventors: Görgen Nilsson, Uppsala (SE);
Stephane Junique, Kista (SE); Wlodek Kaplan, Sollentuna (SE); Peter Norlin, Uppsala (SE)

(73) Assignee: SCANDIDOS AB, Uppsala (SE)

( * ) Notice: Subject to any disclaimer, the term of this patent is extended or adjusted under 35 U.S.C. 154(b) by 101 days.

(21) Appl. No.: 14/118,031

(22) PCT Filed: May 20, 2011

(86) PCT No.: PCT/EP2011/058264
§ 371 (c)(1),
(2), (4) Date: Nov. 15, 2013

(87) PCT Pub. No.: WO2012/159648
PCT Pub. Date: Nov. 29, 2012

(65) Prior Publication Data
US 2014/0091413 A1    Apr. 3, 2014

(51) Int. Cl.
*G01T 1/26* (2006.01)
*G01T 1/24* (2006.01)
*H01L 27/14* (2006.01)
*G01T 1/02* (2006.01)
*H01L 27/146* (2006.01)

(52) U.S. Cl.
CPC ............... *G01T 1/026* (2013.01); *G01T 1/24* (2013.01); *H01L 27/14658* (2013.01)

(58) Field of Classification Search
CPC ...... G01T 1/026; G01T 1/24; H01L 27/14658
USPC ............. 250/363.01, 370.14, 370.08, 370.01
See application file for complete search history.

(56) References Cited

U.S. PATENT DOCUMENTS

| 3,427,454 A | * | 2/1969 | Friederichs .......... A61B 6/4057 250/370.01 |
| 4,039,808 A | | 8/1977 | Tanaka et al. |
| 4,207,518 A | * | 6/1980 | Hopfer ............................ 324/95 |
| 4,214,253 A | * | 7/1980 | Hall .......................... G01T 1/24 257/429 |

(Continued)

FOREIGN PATENT DOCUMENTS

| CN | 1964040 A | 5/2007 |
| EP | 1783498 A2 | 5/2007 |

OTHER PUBLICATIONS

Jursinic Paul et al.: "MapCHECK used for rotational IMRT measurements: Step-and-shoot, Tomotherapy, RapidArc", American Institute of Physics; Medical Physics, vol. 37, No. 6, pp. 2837-2846; Melville, NY, US; May 2010; XP012135817.

(Continued)

*Primary Examiner* — David Porta
*Assistant Examiner* — Blake Riddick
(74) *Attorney, Agent, or Firm* — Harness, Dickey & Pierce PLC

(57) ABSTRACT

The present invention generally relates to a radiation sensor for use particularly in, but by no means exclusively, in measuring radiation dose in photon or electron fields such as for radiation medicine, including radiotherapy and radiation based diagnosis. According to the present invention, there is provided a semiconductor radiation detector comprising a radiation sensitive detector element arranged such that it forms a continuous radiation sensitive portion having surfaces oriented in at least two non-parallel directions.

21 Claims, 3 Drawing Sheets

(56) References Cited

U.S. PATENT DOCUMENTS

| | | | |
|---|---|---|---|
| 5,119,461 A * | 6/1992 | Beyer et al. | 385/147 |
| 5,698,857 A * | 12/1997 | Lambert | C09K 11/673 250/483.1 |
| 6,002,134 A | 12/1999 | Lingren | |
| 6,037,595 A | 3/2000 | Lingren | |
| 6,046,454 A | 4/2000 | Lingren et al. | |
| 6,614,025 B2 * | 9/2003 | Thomson et al. | 250/370.01 |
| 7,371,007 B2 | 5/2008 | Nilsson | |
| 2005/0098730 A1 * | 5/2005 | Yokoi et al. | 250/370.01 |
| 2009/0057562 A1 | 3/2009 | Heijne et al. | |
| 2009/0101875 A1 * | 4/2009 | Boyden et al. | 252/600 |
| 2010/0288916 A1 * | 11/2010 | Cho et al. | 250/252.1 |
| 2010/0320387 A1 * | 12/2010 | Garber et al. | 250/338.4 |
| 2012/0132814 A1 * | 5/2012 | Weinberg | 250/362 |

OTHER PUBLICATIONS

International Search Report PCT/ISA/210 for PCT/EP2011/058264 dated Feb. 6, 2012.
Chinese Second Office Action for Application No. 201180070848.6, with English translation, Jan. 22, 2016.

* cited by examiner

DETECTOR DIODE

CROSS-REFERENCE TO RELATED APPLICATIONS

This application is the national phase under 35 U.S.C. §371 of PCT International Application No. PCT/EP2011/058264 which has an International filing date of May 20, 2011.

TECHNICAL FIELD

The present invention generally relates to a radiation sensor for use particularly in, but by no means exclusively, in measuring radiation dose in photon or electron fields such as for radiation medicine, including radiotherapy and radiation based diagnosis.

BACKGROUND OF THE INVENTION

Cancer therapy utilizing external high energy x-ray, RT (Radiation Therapy), has developed extensively since the introduction of IMRT (Intensity Modulated Radiation Therapy). Traditional RT utilizes radiation beams with homogenous dose distribution in the primary beam. However, due to variations in beam attenuation across the field caused by irregular shape of the patient anatomy and variation in tissue composition, the actual dose distribution in the patient tumor is often more or less heterogenic. In IMRT the dose distribution is optimized to be homogenous in the target. This is accomplished by calculating and delivering the primary beam as a non-flat, intensity modulated beam. The tool used to plan and optimize the treatment is a TPS (Treatment Planning System).

To create the intensity modulated beam, the primary beam is shielded during different time periods for different areas in the field to be treated. This is normally performed by using a MLC (Multi Leaf Collimator) where each individual collimator leaf is controlled separately. A typical MLC have 60-80 pairs of 5 mm leafs, wherein each pair is capable of opening a radiation slit of up to 40 cm.

In the first generation of method for intensity modulated treatment, the treatment delivery was provided in a fixed number of projections. In each projection, either a number of fixed fields with different shapes where provided to create the Intensity Modulated field, so called "step and shoot", or, alternatively, the MLC-leafs were moved when the beam was ON, so called "sliding window".

The introduction of fixed-projection IMRT improved the treatment results compared to previous fixed field technique but the trade-off was significantly increased treatment time and more time was thereby needed to treat each individual patient, which also increased the costs involved in treatment significantly.

Additionally the creation of the intensity modulated fields increased the treatment complexity and new QC (Quality Control) was required to make sure the treatment was given in accordance with the plan created with the TPS. The QC method PTV, "Pre Treatment Verification", was therefore introduced. In PTV, the 3D dose distribution in a phantom (patient substitution) is calculated using the TPS tools for a specific plan and for a specific patient. The phantom doesn't have the same shape and heterogeneities as the patient and thereby the dose distribution will not be the same as in the patient. However, the phantom can be irradiated using the patient specific plan and the dose distribution measured inside the phantom can thereby be compared with the planed dose distribution. If the measured dose distribution in the phantom correlates with the dose distribution in the treatment plan for the phantom, it has been proven that the planned treatment can be given as intended.

The ideal phantom would be similar to the patient in shape and density with detectors in the full 3D volume. That is currently not possible due to costs etc. To measure inside the real patient would require a large number of measurement points which is not feasible either. A technique that optimizes the detector configuration in relation to the requirements is described in the U.S. Pat. No. 7,371,007.

Depending on the intended use for such a phantom, the requirement on the isotropy (measurement dependency on incident angle) might vary. If the phantom is to cover from "head and neck" to pelvis, the requirement on isotropy is somewhat limited due to that the incident angle of the beam is limited to solid angle +/−30 degrees in a 360 degree rotation. If the intended use is to cover also full head including brain; the incident beam might be almost $4\pi$, i.e. almost any beam direction. High accuracy measurements will then require even higher demands on the detector system to be isotropic, i.e. directional independent.

An isotropic detector should also fulfill other requirements such as high spatial resolution, energy independency, dose linearity, dose per pulse linearity, low temperature dependency, stability, high signal/noise ratio, radiation tolerances, real time measurement, configurable in arrays of detectors and not least cost effect to make them useful in practice.

In a first approximation, for a detector that is small compared to the range of the secondary electron that creates the dose (energy per mass), most of the dose detected by the detector originate from electrons generated outside the detector itself and enters the active volume and deposit the dose. If the surrounding material of the small detection volume is inhomogeneous, the generation of the secondary electrons will depend on the mass density and electron density of the surrounding materials and if it varies the detector will not be isotropic, thereby it is important to have a homogeneous or symmetric surrounding of the detector volume.

In a traditional diode-detector-chip part of the chip is active and part of it is inactive (bulk) in the collection of free charges. The geometric shape is thereby none uniform around the active part of the chip and the secondary electrons from the surrounding will thereby not be uniform; the creation of the local dose will become directional dependent.

Secondary electrons that enter the active volume via the bulk silicon respectively directly via e.g. water equivalent surrounding the active volume will create different amounts of secondary electrons and thereby the imparted dose will vary with the incident angle.

Attempts to provide isotropic detectors have been made, in the early 1990's a double chip (sandwich) detector was constructed to reduce the effect mentioned above. The sandwich detector was more isotropic than a single chip detector but is however impaired with drawbacks. For example, the construction requires that the active part is symmetrically placed in relation to the bulk-silicon and symmetric in shape which, for example, makes it difficult to manufacture. These geometrical asymmetries may lead to a signal response which is not independent of the direction of the incoming radiation.

Another issue in detectors where the density differs from the surrounding material is energy dependency. The attenuation of low energy (<200 keV) photons is for example up to 7 times higher than in water, which leads to an energy dependency in a sandwich construction being more pronounced than in a single chip detector where almost 50% of the surface is facing the surrounding material.

Another attempt to provide an isotropic detector is presented in US 2009/0057562, where a method, apparatus, and computer program for measuring the dose, dose rate or composition of radiation are disclosed. In one embodiment, an apparatus for detecting and measuring an ambient unknown radiation field includes a large number of detector chips that are facing in different directions is disclosed. However, the detector presented in US 2009/0057562 may also be impaired with problems related to the symmetry of the detector chips, which, in turn, may lead to a signal response which is not independent of the direction of the incoming radiation.

Thus, there is still a need within the art for isotropic detectors having a signal response which is independent of the direction of the incoming radiation that at the same time fulfill other important requirements, such as high spatial resolution, energy independency, dose linearity, dose per pulse linearity, low temperature dependency, stability, high signal/noise ratio, radiation tolerances, real time measurement, on a detector system for use in measuring radiation dose in photon or electron fields such as for radiation medicine, including radiotherapy and radiation based diagnosis.

SUMMARY OF THE INVENTION

An object of the present invention is to provide an isotropic detector that fulfills at least some of the following requirements, such as high spatial resolution, energy independency, dose linearity, dose per pulse linearity, low temperature dependency, stability, high signal/noise ratio, radiation tolerances, real time measurement, on a detector system for use in measuring radiation dose in photon or electron fields such as for radiation medicine, including radiotherapy and radiation based diagnosis.

Further objects and advantages of the present invention will be discussed below by means of exemplifying embodiments.

This and other features, aspects and advantages of the invention will be more fully understood when considered with respect to the following detailed description, appended claims and accompanying drawings.

According to an aspect of the present invention, there is provided a semiconductor radiation detector comprising a detector element arranged to receive radiation in at least two-non parallel directions and to produce an output corresponding to the received radiation.

According to embodiments of the present invention, there is provided a semiconductor radiation detector comprising a detector element arranged such that it forms a continuous radiation sensitive portion having surfaces oriented in at least two non-parallel directions.

In embodiments of the present invention, the semiconductor radiation detector comprises contact means arranged in connection with the detector element for connecting the detector to external equipment.

According to embodiments of the present invention, the detector element is arranged such that it forms a continuous radiation sensitive portion having surfaces oriented in at least two perpendicular directions.

In embodiments of the present invention, the detector element is arranged such that it forms a continuous radiation sensitive portion having surfaces oriented in three perpendicular directions.

According to embodiments of the present invention, the semiconductor radiation detector further comprises a semiconductor base material. The detector element is provided on the semiconductor base material and is shaped such that it forms a continuous radiation sensitive portion together with the semiconductor base material and the contact means is arranged in connection with the semiconductor base material and the detector element for connecting the detector to external equipment.

In embodiments of the present invention, the detector element is a depleted continuous layer provided on all sides of the semiconductor base material.

According to embodiments of the present invention, the semiconductor base material is shaped as a polyhedron and the detector element is provided on all sides of the polyhedral semiconductor base material. Further, the contact means is arranged on one side of the semiconductor base material in connection with the semiconductor base material and the detector element.

According to embodiments of the present invention, semiconductor base material is shaped as a cube and the detector element is provided on all six sides of the cube shaped semiconductor base material. Further, the contact means is arranged on one side of the cube shaped semiconductor base material in connection with the semiconductor base material and the detector element.

In further embodiments of the present invention, the semiconductor base material has a spherically-like shape and the detector element is provided on the surface of the semiconductor base material. Further, the contact means is arranged on the surface of the semiconductor base material in connection with the semiconductor base material and the detector element.

According to embodiments of the present invention, the semiconductor base material has a rhombohedral shape and the detector element is provided on all sides of the semiconductor base material. Further, the contact means is arranged on one side of the rhombohedron in connection with the semiconductor base material and the detector element.

In embodiments of the present invention, the detector element is a n-type material or a p-type material to form a n-Si detector, a p-Si detector, a n-MOSFET detector, or a p-MOSFET detector.

Furthermore, according to embodiments of the present invention, a pn-junction is arranged on all sides of the cube shaped semiconductor base material, rhombic shaped semiconductor base material, or on the spherically-like shaped semiconductor base material to form a diode detector.

According to embodiments of the present invention, the semiconductor radiation detector includes a continuous active volume located within the detector.

According to embodiments of the present invention, the semiconductor radiation detector has a cube-like shape and includes a continuous active volume having a spherical or ellipsoidal shape centrally located in the detector and semiconductor base material regions in corners of the detector.

According to embodiments of the present invention, the semiconductor radiation detector further includes a first contact being in contact with a semiconductor base material region and a second contact being in contact with the active volume.

According to embodiments of the present invention, at least one side or outer surface of the semiconductor radiation detector is curved or bent.

Further objects and advantages of the present invention will be discussed below by means of exemplifying embodiments.

These and other features, aspects and advantages of the invention will be more fully understood when considered with respect to the following detailed description, appended claims and accompanying drawings.

BRIEF DESCRIPTION OF THE DRAWINGS

Exemplifying embodiments of the invention are illustrated by way of example and not by way of limitation in the figures of the accompanying drawings in which like references indicate similar elements. It should be noted that references to "an" or "one" embodiment in this discussion are not necessarily to the same embodiment, and such references mean at least one.

DESCRIPTION OF EXEMPLIFYING EMBODIMENTS

The following is a description of exemplifying embodiments in accordance with the present invention. This description is not to be taken in limiting sense, but is made merely for the purposes of describing the general principles of the invention. It is to be understood that other embodiments may be utilized and structural and logical changes may be made without departing from the scope of the present invention.

First, an example process for manufacturing a semiconductor radiation detector according to an embodiment of the present invention will be briefly described. This embodiment of a semiconductor radiation detector is a cubically shaped detector having six radiation sensitive surfaces and thus has a reduced or, in practice, a close to zero directional dependence. In this example process, the detector is manufactured in one of the Si layers of a silicon-on-insulator (SOI) wafer. This example process involves particularly:

Creating four vertical surfaces by deep reactive ion etching of trenches through one of the Si layers of the SOI wafer, with the buried oxide acting as on etch-stop. The vertical surfaces as well as the top surface are doped from a gaseous source at elevated temperatures. Gaseous diffusion down through the trenches enables doping of vertical surfaces.

Re-filling the trenches by deposition of one or more thin film layers to preserve the mechanical integrity of the wafer and to create a planar surface for subsequent processing.

Etching away the second Si layer of the SOI wafer which has acted as a carrier. The re-filled trenches entails that the remaining wafer is held together without the carrier. After this step, the sixth surface of the cubic chip is exposed and is doped, e.g. by ion implantation. Metallization, passivation and chip dicing may then be carried out by conventional processing.

Figure 1A:
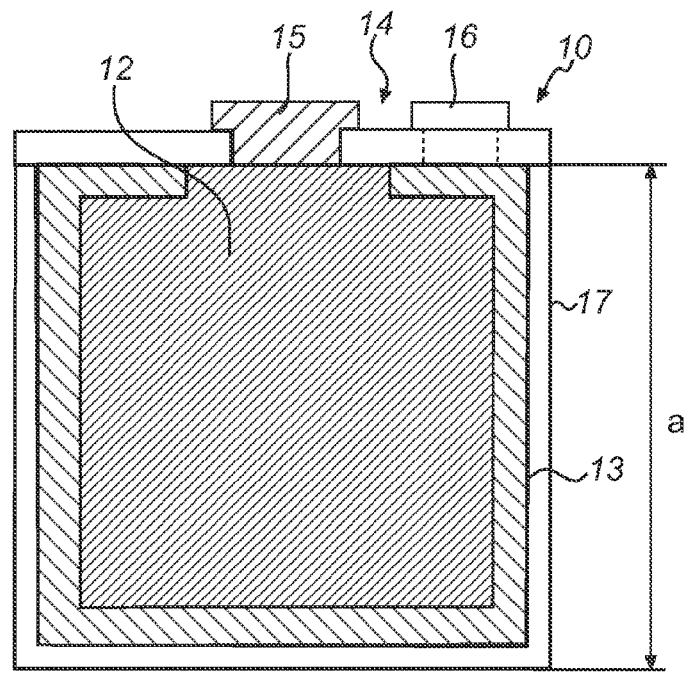
FIG. 1a schematically shows a cross-sectional view of an embodiment of a semiconductor radiation detector according the present invention.
Figure 1B:
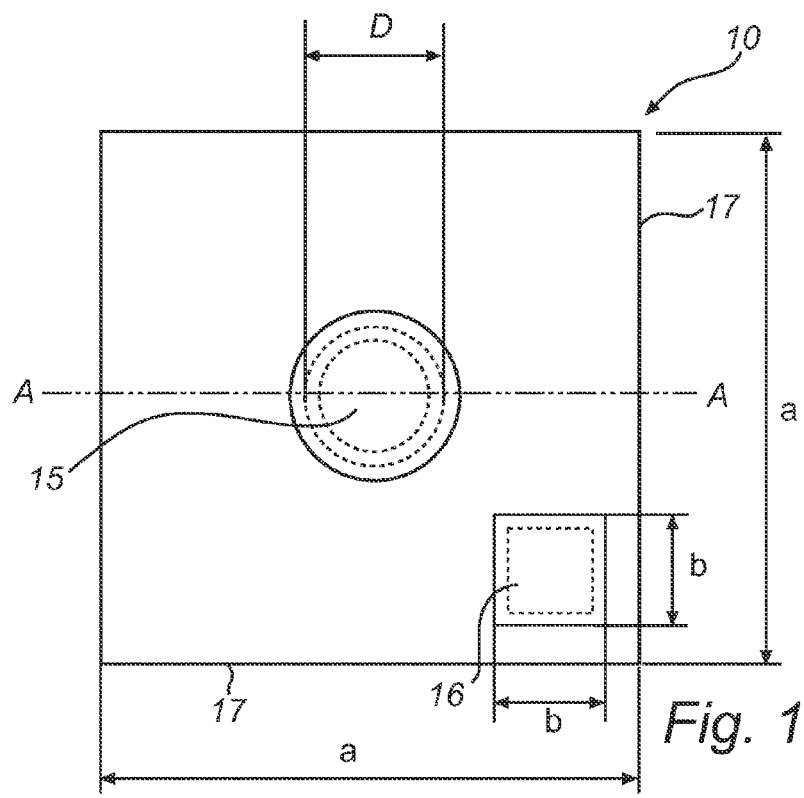
FIG. 1b schematically shows the semiconductor radiation detector according the present invention shown in FIG. 1a from a different view.

With reference to FIGS. 1a and 1b, an embodiment of the detector according to the present invention, which can be fabricated using the principles described above, will be discussed. FIG. 1a schematically shows the semiconductor radiation detector in cross-section along the line A-A in FIG. 1b and FIG. 1b schematically shows the semiconductor radiation detector seen the direction of the arrow in FIG. 1a.

The semiconductor radiation detector 10 according to this specific embodiment includes a cubically shaped p-doped bulk silicon semiconductor base material 12. Detector element 13 is provided on the semiconductor base material 12. The detector element 13 is $n^+$-doped silicon and is provided as a continuous layer on all six sides of the cubically shaped semiconductor base material 12. The semiconductor base material 12 and the detector element 13 together form a cube having a side length a.

Furthermore, contact means 14 is provided on one side of the cubically shaped semiconductor base material 12. In this embodiment, a first circular contact pin 15 is provided in contact with the semiconductor base material 12 and is arranged with a diameter D. A second square-shaped contact pin 16 is provided in contact with the detector element 13 and is arranged with a side length b.

In this embodiment of the present invention, the first and second contact pins 15, 16 are made of aluminum. Moreover, an outer radiation transparent protection layer 17 made of silicon-oxide ($SiO_2$) is provided on the detector element 13. Hence, pn-junctions are formed on all six sides of the cubically shaped semiconductor radiation detector 10. The semiconductor radiation detector 10 according to the present invention enables measurements of X-ray radiation with a reduced or even close to zero directional dependence. Further, as the active volume of the detector 10 is symmetrically distributed in three dimensions, the lateral extension of the detector can be reduced, which inter alia results in an increased number of detectors per wafer area.

Figure 2A:
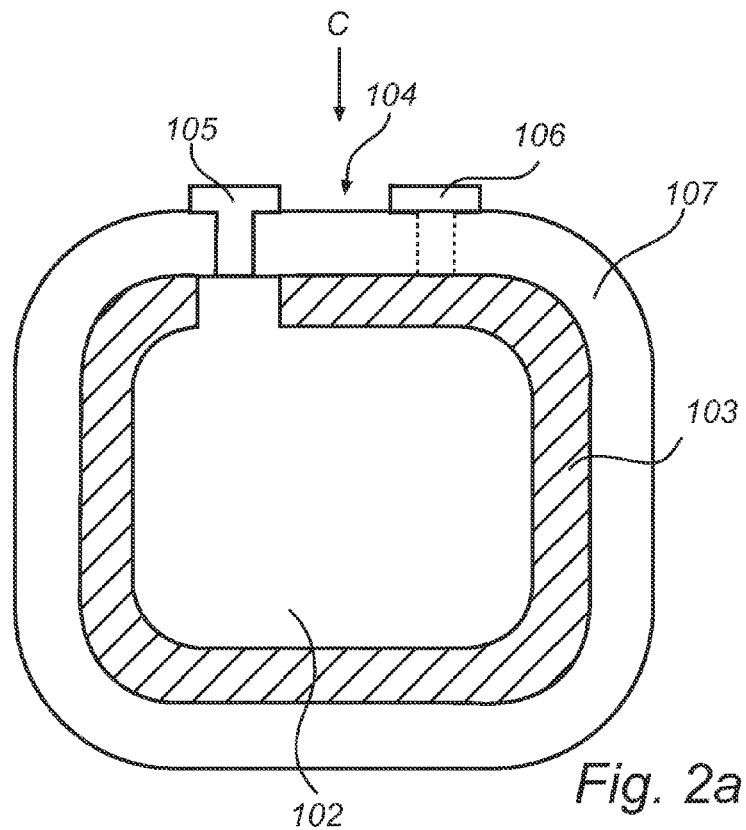
FIG. 2a schematically shows a cross-sectional view of an embodiment of a semiconductor radiation detector according the present invention.
Figure 2B:
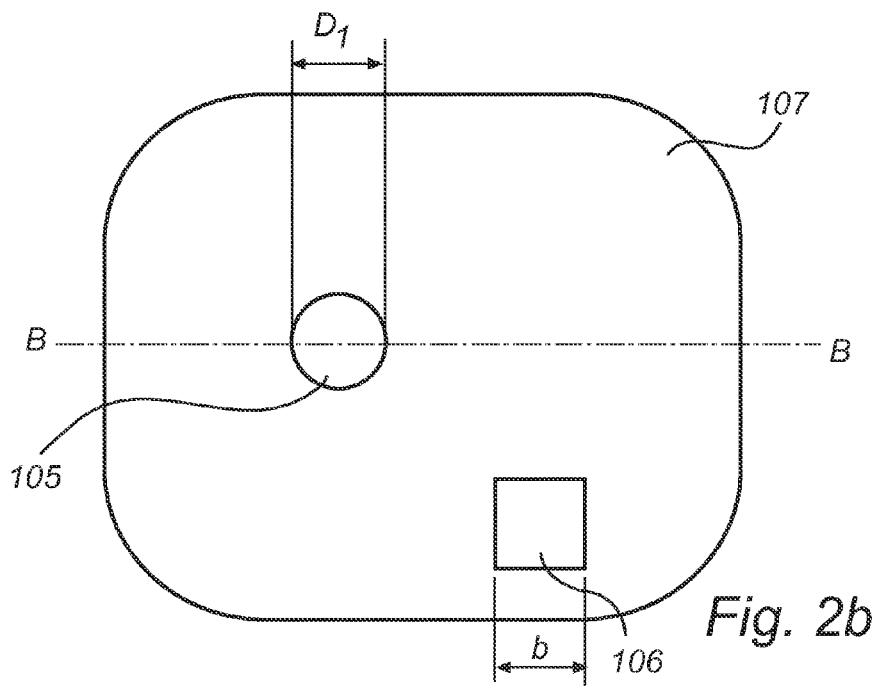
FIG. 2b schematically shows the semiconductor radiation detector according the present invention shown in FIG. 2a from a different view FIG. 3a schematically shows an embodiment of a semiconductor radiation detector according the present invention.

With reference now to FIGS. 2a and 2b, another embodiment of a semiconductor radiation detector according to the present invention will be discussed. FIG. 2a schematically shows the semiconductor radiation detector in cross-section along the line B-B in FIG. 2b and FIG. 2b schematically shows the semiconductor radiation detector seen from the direction of the arrow C in FIG. 2a.

The semiconductor radiation detector 100 according to this specific embodiment includes a spherically-like shaped p-doped bulk silicon semiconductor base material 102 or a semiconductor base material 102 having cube-like structure with rounded edges and corners. A detector element 103 is provided on the semiconductor base material 102. The detector element 103 is $n^+$-doped silicon and is provided as a continuous layer on the spherically shaped semiconductor base material 102. The semiconductor base material 102 and the detector element 103 form a sphere-like structure or cube-like structure with rounded edges.

Furthermore, contact means 104 is provided on the detector 100. In this embodiment, a first circular contact pin 105 is provided in contact with the semiconductor base material 102 and is arranged with a diameter $D_1$. A second square-shaped contact pin 106 is provided in contact with the detector element 103 and is arranged with a side length b.

In this embodiment of the present invention, the first and second contact pins 105, 106 are made of aluminum. Moreover, an outer radiation transparent protection layer 107 made of silicon-oxide ($SiO_2$) is provided on the detector element 103. Hence, a pn-junction is formed on the spherically-like semiconductor radiation detector 100. The semiconductor radiation detector 100 according to the present invention enables measurements of X-ray radiation with a reduced or even close to zero directional dependence. Further, as the active volume of the detector 100 is symmetrically distributed in three dimensions, the lateral extension of the detector can be reduced, which inter alia results in an increased number of detectors per wafer area.

Figure 3A:
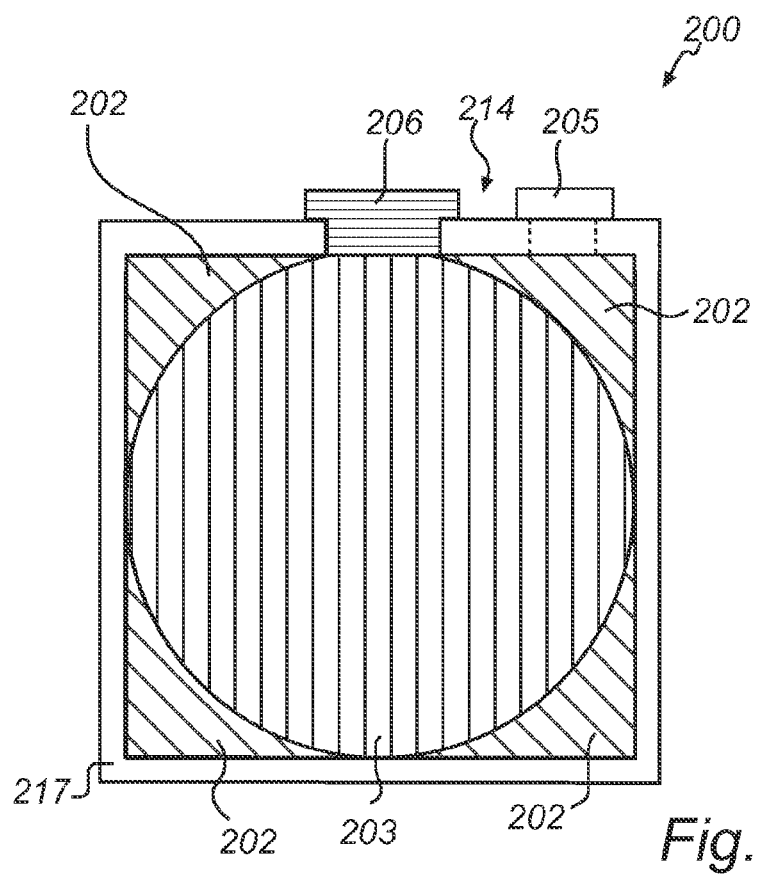
FIG. 3b schematically shows the semiconductor radiation detector according the present invention shown in FIG. 3a from a different view.
Figure 3B:
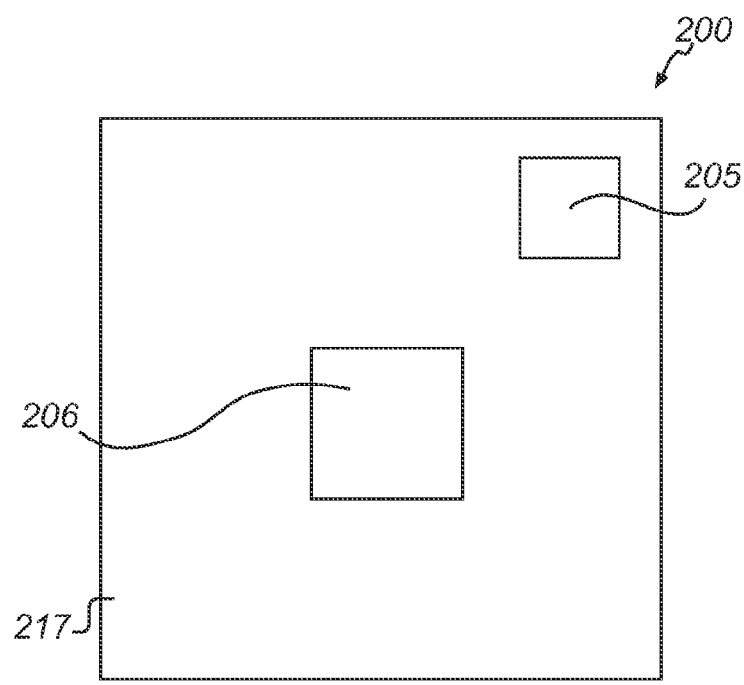

According to a further embodiment of the present invention shown in FIGS. 3a and 3b, the semiconductor radiation detector includes a spherical-like detector element in a cube-like detector. The detector element is, for example, $n^+$-doped silicon and is provided as a continuous active volume. The detector element 203 is, in this embodiment, substantially circular but may also be, for example, ellipsoidal. The detector 200 is cube-shaped and includes p-doped bulk silicon semiconductor base material regions 202 in the corners. Contact means 214 is arranged for connection to external equipment including contact pins made of aluminum may be provided on the detector. For example, a first contact pin 205 may be arranged close to a semiconductor base material region 202 in one of the corners of the detector 200 in contact with the detector element 203 and a second contact pin 206 may be arranged in contact with the spherically shaped active region of the detector 200. Moreover, an outer radiation transparent protection layer 217 made of silicon-oxide ($SiO_2$) may be provided on the detector element. The continuous active volume may have a cube-like shape, an ellipsoidal shape, a cylindrical shape, a spherical shape, or a pyramid-like shape. However, other geometrical shapes are conceivable.

Although certain embodiments and examples have been described herein, it will be understood by those skilled in the art that many aspects of the devices and methods shown and described in the present disclosure may be differently combined and/or modified to form still further embodiments. Alternative embodiments and/or uses of the devices and methods described above and obvious modifications and equivalents thereof are intended to be within the scope of the present disclosure. Thus, it is intended that the scope of the present invention should not be limited by the particular embodiments described above, but should be determined by a fair reading of the claims that follow.

The invention claimed is:

1. A phantom Intensity Modulated Radiation Therapy (IMRT) semiconductor radiation detector, comprising:
   a three-dimensional semiconductor base material; and
   a detector element continuously arranged around the semiconductor base material such that the detector element and the semiconductor base material form a single piece, the detector element forms a continuous X-ray radiation sensitive pn-junction with at least a portion of the semiconductor base material, the detector element continuously arranged on all sides of the semiconductor base material such that the detector element partially surrounds the semiconductor base material, the detector element configured to
   receive radiation in at least two non-parallel directions, and
   produce an output corresponding to the received radiation.

2. The phantom IMRT semiconductor radiation detector of claim 1, further comprising:
   a connector connected to the continuous radiation sensitive pn-junction of the detector element, the connector configured to connect the detector element to an external equipment.

3. The phantom IMRT semiconductor radiation detector of claim 2, wherein the detector element is oriented in three perpendicular directions.

4. The phantom IMRT semiconductor radiation detector of claim 1, wherein the detector element is oriented in at least two perpendicular directions.

5. The phantom IMRT semiconductor radiation detector of claim 1, wherein the detector element is oriented in three perpendicular directions.

6. The phantom IMRT semiconductor radiation detector of claim 5, further comprising:
   a connector configured to connect the detector element and the semiconductor base material to an external equipment,
   wherein the radiation sensitive pn-junction is formed between the semiconductor base material and the detector element.

7. The phantom IMRT semiconductor radiation detector of claim 1, further comprising:
   a connector configured to,
      connect the detector element and the semiconductor base material to an external equipment,
   wherein the radiation sensitive pn-junction is formed between the base material and the detector element.

8. The phantom IMRT semiconductor radiation detector of claim 7, wherein the detector element is a depleted continuous layer.

9. The phantom IMRT semiconductor radiation detector of claim 8, wherein,
   the semiconductor base material is polyhedral shaped, and
   the connector is on one side of the semiconductor base material, the connector is in connection with the semiconductor base material and the detector element.

10. The phantom IMRT semiconductor radiation detector of claim 8, wherein,
    the semiconductor base material is cube shaped, and
    the connector is on one side of the cube shaped semiconductor base material, and the connector is in connection with the semiconductor base material and the detector element.

11. The phantom IMRT semiconductor radiation detector of claim 8, wherein,
    the semiconductor base material is spherical shaped,
    the detector element is provided on the spherical shaped semiconductor base material, and
    the connector is arranged on the semiconductor base material, the connector is in connection with the semiconductor base material and the detector element.

12. The phantom IMRT semiconductor radiation detector of claim 8, wherein,
    the semiconductor base material is rhombohedron shaped, and
    the connector is arranged on one side of the semiconductor base material, the connector is in connection with the semiconductor base material and the detector element.

13. The phantom IMRT semiconductor radiation detector of claim 1, wherein,
    the detector element is a n-type material, a p-type material, a p-Si detector, a n-MOSFET detector, or a p-MOSFET detector.

14. A phantom Intensity Modulated Radiation Therapy (IMRT) semiconductor radiation detector comprising:
a semiconductor base material; and
a three-dimensional detector element continuously arranged on all sides of the semiconductor base material such that the detector element partially surrounds the semiconductor base material to form a single piece, the detector element forms a X-ray radiation sensitive pn-junction with the semiconductor base material, the detector element configured to receive radiation in at least two-non parallel directions, and
produce an output corresponding to the received radiation.

15. The phantom IMRT semiconductor radiation detector of claim 14, further comprising:
a connector configured to connect the detector element and the semiconductor base material to an external equipment.

16. The phantom IMRT semiconductor radiation detector of claim 15, wherein the connector further comprises:
a first contact pin in contact with the semiconductor base material, the first contact pin is circular shaped; and
a second contact pin in contact with the detector element, the second contact pin is square shaped.

17. The phantom IMRT semiconductor radiation detector of claim 16, wherein
the first contact pin and the second contact pin are on a first surface of the semiconductor radiation detector such that the first contact pin is centrally positioned on the first surface and the second contact pin is offset from the first contact pin.

18. The phantom IMRT semiconductor radiation detector of claim 14, wherein the detector element is a n-type material or a p-type material, such that the semiconductor radiation detector is a p-Si detector, a n-Si detector, a n-MOSFET detector, or a p-MOSFET detector.

19. A phantom Intensity Modulated Radiation Therapy (IMRT) semiconductor radiation detector comprising:
an outer radiation transparent protection layer; and
a three-dimensional detector element at least partially enclosed within the outer radiation transparent protection layer, the detector element being at least one of cube shaped, spherical shaped and ellipsoidal shaped, the detector element configured to receive radiation in at least two non-parallel direction, and produce an output corresponding to the received radiation; and
a plurality of semiconductor base material regions configured to form a X-ray radiation sensitive pn-junction with the detector element,
wherein at least one semiconductor base material region of the plurality of semiconductor base material regions is positioned in a corner between the outer radiation transparent protection layer and the detector element,
wherein at least a portion of the detector element is in contact with a portion of the outer transparent protection layer, such that the portion of the detector element is between separate semiconductor base material regions that are in contact with the portion of the outer radiation transparent protection layer.

20. The phantom IMRT semiconductor radiation detector of claim 19, further comprising:
a first contact in contact with the at least one of the plurality of semiconductor base material regions, and
a second contact in contact with the detector element.

21. An Intensity Modulated Radiation Therapy (IMRT) phantom comprising:
a plurality of IMRT semiconductor radiation detectors configured to determine a dose distribution in the phantom, each IMRT semiconductor radiation detector including,
a three-dimensional semiconductor base material, and
a detector element continuously arranged around the semiconductor base material such that the detector element and the semiconductor base material form a single piece, the detector element forms a continuous X-ray radiation sensitive pn-junction with at least a portion of the semiconductor base material, the detector element continuously arranged on all sides of the semiconductor base material such that the detector element partially surrounds the semiconductor base material, the detector element configured to receive radiation in at least two non-parallel directions, and
produce an output corresponding to the received radiation.

* * * * *